US008237504B1

(12) United States Patent
Moochalla et al.

(10) Patent No.: US 8,237,504 B1
(45) Date of Patent: Aug. 7, 2012

(54) MICROWAVE VARIABLE POWER SOLID STATE POWER AMPLIFIER (SSPA) WITH CONSTANT EFFICIENCY AND LINEARITY

(75) Inventors: Shabbir S. Moochalla, Kendall Park, NJ (US); William J. Taft, Yardville, NJ (US); Johan Ramirez, Reading, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/699,103

(22) Filed: Feb. 3, 2010

Related U.S. Application Data

(60) Provisional application No. 61/150,278, filed on Feb. 5, 2009.

(51) Int. Cl.
*H03G 3/10* (2006.01)

(52) U.S. Cl. ........................................ 330/285; 330/296

(58) Field of Classification Search .................. 330/285, 330/296, 310–311, 133, 150, 129; 300/98
See application file for complete search history.

(56) References Cited

U.S. PATENT DOCUMENTS

| | | | | |
|---|---|---|---|---|
| 6,356,745 | B1 * | 3/2002 | Lee et al. | 455/232.1 |
| 7,535,297 | B2 | 5/2009 | Chen et al. | |
| 7,551,689 | B2 | 6/2009 | Chan et al. | |
| 7,564,311 | B2 * | 7/2009 | Rohani et al. | 330/285 |

OTHER PUBLICATIONS

K. Narendra et al., "A Novel Adaptive LDMOS Power Amplifier With Constant Efficiency for Wide Dynamic Power Levels Control", Microwave Symposium Digest, 2008, IEEE MTT-S International.

* cited by examiner

*Primary Examiner* — Hieu Nguyen

(74) *Attorney, Agent, or Firm* — McDermott Will & Emery LLP

(57) ABSTRACT

A method of fabricating a solid state power amplifier (SSPA) having variable output power is provided. The method includes coupling a first transistor device to a second transistor device and biasing a drain input of each of the first and second transistor device. Further, the method includes biasing a gate input of each of the first and second transistor device varying a drain to source current of each of the first and second transistor device to enable the SSPA to maintain high power added efficiency (PAE) and consistent linearity over a range of output power levels.

16 Claims, 3 Drawing Sheets

| DC BIAS CONDITIONS | | | | | | | |
|---|---|---|---|---|---|---|---|
| DRAIN VOLTAGE (V) (DRIVER) | DRAIN CURRENT (A) (DRIVER) | DRAIN VOLTAGE (V) (OUTPUT) | DRAIN CURRENT (A) (OUTPUT) | $P_{out}$ (dBm) | GAIN (dB) | PAE (%) | NPR (dB) |
| 6 | 1.7 | 9.5 | 4 | 46 | 41.4 | 38.77 | 14.33 |
| 5 | 1.1 | 5.5 | 2 | 41 | 39.5 | 39.39 | 14.34 |

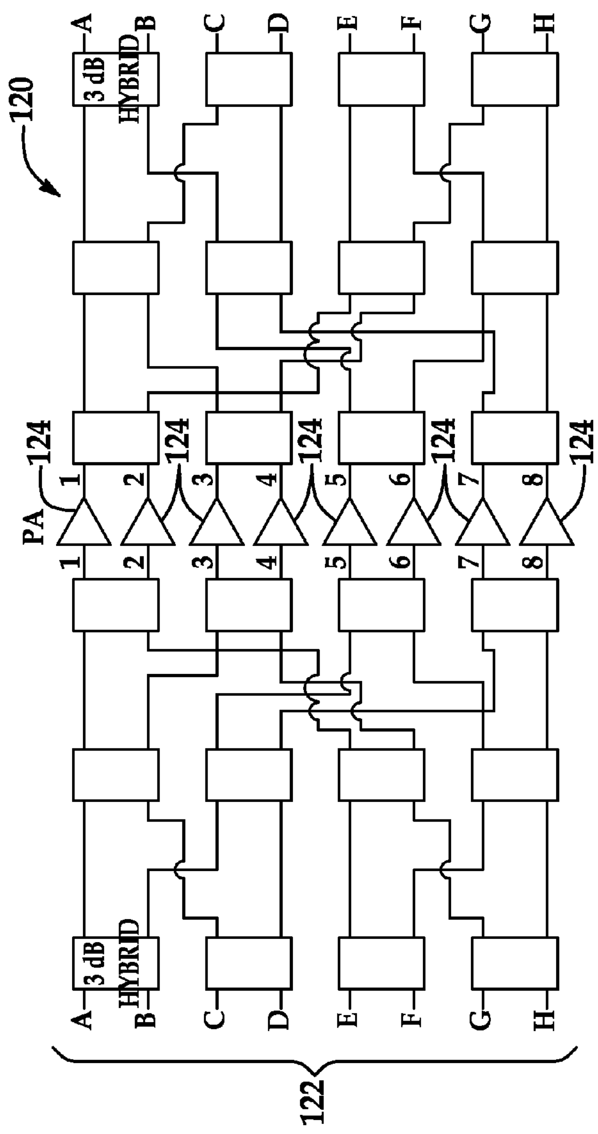

FIG. 5

COUPLE A FIRST TRANSISTOR DEVICE TO A SECOND TRANSISTOR DEVICE — 200

BIAS A DRAIN INPUT OF EACH OF THE FIRST AND SECOND TRANSISTOR DEVICE — 202

BIAS A GATE INPUT OF EACH OF THE FIRST AND SECOND TRANSISTOR DEVICE VARYING A DRAIN TO SOURCE CURRENT OF EACH OF THE FIRST AND SECOND TRANSISTOR DEVICE TO ENABLE THE SSPA TO MAINTAIN HIGH POWER ADDED EFFICIENCY (PAE) AND CONSISTENT LINEARITY OVER A RANGE OF OUTPUT POWER LEVEL — 204

FIG. 6

MICROWAVE VARIABLE POWER SOLID STATE POWER AMPLIFIER (SSPA) WITH CONSTANT EFFICIENCY AND LINEARITY

CROSS REFERENCE TO RELATED APPLICATIONS

The present application claims the benefit of U.S. Provisional Patent Application Ser. No. 61/150,278 filed Feb. 5, 2009, the contents of which are incorporated by reference herein.

BACKGROUND OF INVENTION

The performance of microwave high power amplifiers (HPAs) is a key driver to establish overall satellite communication (SATCOM) payload performance. The total direct current (DC) power consumption within a communications satellite (COMSAT) is primarily based on the HPA DC to radio frequency (RF) efficiency at a given RF output power level; the DC to RF power-added efficiency (PAE) of the HPA is a key measure of performance. Fixed satellite service (FSS) and mobile satellite service (MSS) communications each require operation of the HPAs under multi-carrier operation to meet demanding high volume traffic conditions. Typically, for SATCOM frequencies at UHF (225-400 MHz), L-band (1.2-1.8 GHz), S-Band (2-3 GHz) and C-Band (3.7-4.2 GHz), solid-state-power amplifiers (SSPAs) are the preferred method of HPA implementation vs. heavier and more expensive travelling wave tube amplifiers (TWTAs), and can be used individually or in combination within a multi-port amplifier (MPA) configuration for maximum flexibility.

For these communications systems, the minimization of distortion under multi-carrier operation to avoid interference between SATCOM users is critical to maintain high quality of service. High linearity within the HPA to reduce spectral regrowth due to generation of inter-modulation distortion (IMD) needs to be maintained for varying operating conditions. In a multi-carrier operation, a very good indicator of linearity is a good NPR (noise power ratio).

Additionally, based on traffic conditions, the HPA output power will vary over a significant RF power range, typically 5 dB or greater; maintaining IMD, NPR and PAE performance over this range of RF power output levels are typically in conflict, resulting in either a sacrifice in NPR or PAE performance resulting using conventional techniques.

SUMMARY OF THE INVENTION

These and other advantages and features will become more apparent from the following description taken in conjunction with the drawings.

According to one embodiment of the invention, a method of fabricating a solid state power amplifier (SSPA) having variable output power is provided. The method includes coupling a first transistor device to a second transistor device; and biasing a drain input of each of the first and second transistor device and biasing a gate input of each of the first and second transistor device varying a drain to source current of each of the first and second transistor device to enable the SSPA to maintain high power added efficiency (PAE) and consistent linearity over a range of output power levels.

According to another embodiment of the invention, a method fabricating a solid state power amplifier (SSPA) having variable output power is provided. The method includes coupling a first transistor device to a second transistor device; selecting a predetermined set of direct current (DC) biasing conditions based on an input power level received by the SSPA; and biasing a drain input of each of the first and second transistor device and biasing a gate input of each of the first and second transistor device according to the predetermined set of DC biasing conditions varying a drain to source current of each of the first and second transistor device to enable the SSPA to maintain high power added efficiency (PAE) and consistent linearity over a range of output power levels.

According to yet another embodiment of the invention, a solid state power amplifier (SSPA) having variable output power is provided. The SSPA includes a first transistor device coupled to a second transistor device; and a power converter in signal communication with the first transistor and the second transistor, the power converter being configured to bias a gate input of each of the first and second transistor device and bias a drain input of each of the first and second transistor device according to a predetermined set of biasing conditions varying a drain to source current of each of the first and second transistor device to enable the SSPA to maintain high power added efficiency (PAE) and consistent linearity (NPR) over a range of output power levels.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 5 illustrates a schematic of a multi-port amplifier implementing one or more SSPAs according to an embodiment of the invention; and FIG. 6 is a flow diagram illustrating a method of fabricating the SSPA having variable output power in accordance with an embodiment of the invention.

DETAILED DESCRIPTION

A solid-state power amplifier (SSPA) used in data transmission and communication systems (e.g., satellite communication systems), active phased arrays and systems integration is described herein. In an exemplary embodiment, the SSPA described herein is used in an on-orbit application. The invention also includes methods of fabricating an SSPA having variable output power with high and constant power added efficiency (PAE) and good linearity. In another embodiment, the SSPA described herein is configured to maintain high PAE and good linearity while continuously operating over a range of output power levels. The methods described herein enable the SSPA to vary its output power over a range of at least approximately 5 dB and maintain constant PAE and linearity in accordance to one embodiment.

For all general purposes, the term "signal" as used herein is defined as any electrical signal or any stored or transmitted value. For example, a signal can comprise a voltage, or a current. Further, a signal can comprise any stored or transmitted value such as binary values, scalar values or the like.

Figures 1, 2:
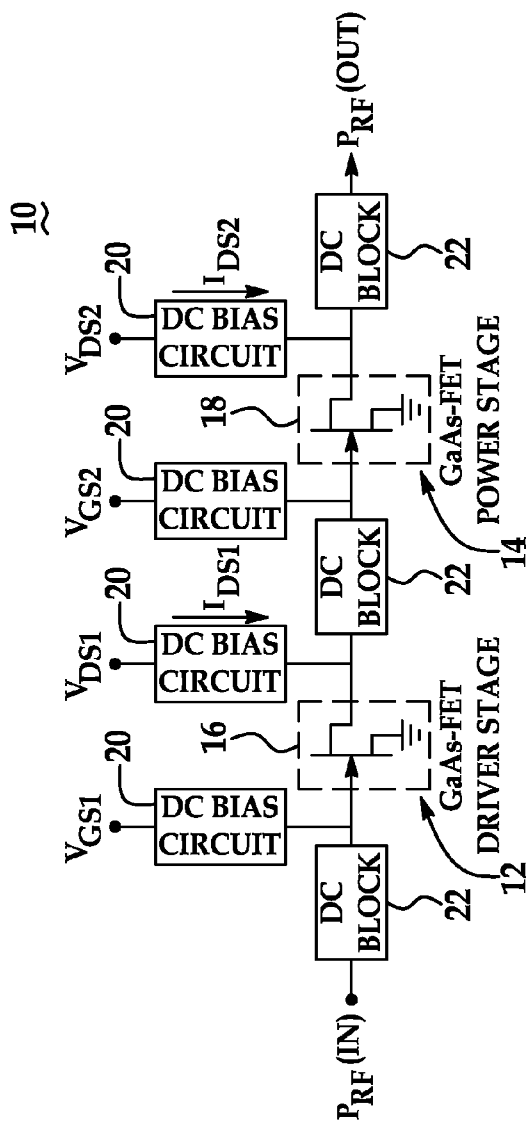
FIG. 1 is a basic schematic diagram of a solid-state power amplifier (SSPA) according to an embodiment of the invention.
FIG. 2 is an exemplary table of results of a set of predetermined DC bias conditions for two RF output power levels for the SSPA in FIG. 1.

Referring now to the drawings where the invention will be described with reference to specific embodiments with limiting the same, FIG. 1 illustrates a schematic diagram of the basic elements of a solid state power amplifier (SSPA) 10 having variable RF output power with high power-added efficiency (PAE) and good linearity (noise to power ratio (NPR)) according to an exemplary embodiment. The SSPA 10 generally includes a driver stage 12 and a power stage 14. Each stage 12, 14 includes a field-effect transistor (FET) or a transistor device 16, 18 respectively, forming the two-stage SSPA 10 configuration. Each stage 12, 14 can include more than one FET. However, for ease of discussion, only a single transistor device 16, 18 is illustrated in FIG. 1 for each stage. Moreover, a two-stage SSPA 10 configuration is illustrated in FIG. 1. However, it is understood that the driver stage 12 and/or power stage 14 can be configured with additional stages other than those shown, using discrete or conventional monolithic microwave integrated circuits (MMICs) according to other embodiments. In other words, each stage can be a multiple-balanced amplifier. For example, the power stage 14 can be a multiple output stage having one or more transistors or a parallel combination of multiple transistors.

The transistor device 16 of the driver stage 12 is electrically coupled to the transistor device 18 of the power stage 14 as shown in FIG. 1. The gate input of the transistor device 16 is biased to a gate biasing voltage $V_{GS1}$, while the drain input of transistor device 16 is biased to a drain bias voltage $V_{DS1}$. As such, the gate voltage of transistor device 16 is set to $V_{GS1}$ and the drain voltage of transistor device 16 is set to $V_{DS1}$. Similarly, the gate input of the transistor device 18 is biased to a gate bias voltage $V_{GS2}$ while the drain input of transistor device 18 is biased to a drain bias voltage $V_{DS2}$. As such, the gate voltage of the transistor device 18 is set to $V_{GS2}$ and the drain voltage $V_{DS2}$ of transistor device 18 is set to $V_{DS2}$. Controlling the DC bias conditions of transistor device 16 in the driver stage 12 and transistor device 18 in the power stage 14 enables the SSPA performance to provide high and constant PAE (efficiency) and good NPR (linearity) for a range of RF output power levels. In the exemplary embodiment shown, the range of RF output power levels allows at least approximately a 5 dB variation.

In accordance with the embodiment shown, the SSPA 10 includes at least one DC bias circuit 20 configured to avoid oscillations at different drain and gate voltages. In the embodiment, at least one DC bias circuit 20 is disposed along the gate input and the drain input of each of the transistor devices 16, 18. The DC bias circuits 20 can each provide low impedance at low frequency and high impedance at operating frequency. In an embodiment, the DC bias circuits 20 comprise wire wound chokes that reduce DC drop and provide high impedance at operating frequency. In another embodiment, the DC bias circuits 20 could include quarter wavelength micro-strip lines, which are generally used for high operating frequencies. Of course, the DC bias circuit can include one or a number of electrical components configured to provide low impedance or high impedance depending on the frequency.

The SSPA 10 also includes one or more DC blocking networks 22 configured to block the drain to source voltage from interfering with the gate to source voltage at each stage 12, 14 of the SSPA 10. In the embodiment shown, at least one DC blocking network 22 is disposed along the input and output of each transistor device 16, 18. The DC block networks 22 can be any conventional blocking network and is not limited to the configuration described herein.

The transistor devices 16, 18 are biased in response to an RF input power, generally indicated as $P_{RF}$ (IN), received by the SSPA 10. The drain bias voltages $V_{DS1}$ and $V_{DS2}$ and the drain current of transistor device 16 and the drain current of the transistor device 18, generally indicated as $I_{DS1}$ and $I_{DS2}$ respectively, are selected such that constant PAE and NPR performance are maintained over a range of RF output power levels. The drain currents are varied by controlling the gate bias voltages for both driver and power stages 12, 14 using the basic FET function of a voltage controlled current source. Using both drain bias voltage and drain current control on both the driver and power stages 12, 14 provides an effective technique to maintain constant PAE and NPR performance over a range of RF power output levels.

The output stage 14 provides a primary effect on the PAE and NPR performance of the SSPA 10 while the driver stage 12 provides a secondary effect in accordance to the embodiment shown. In other words, the driver stage 12 is operated to improve linearity and efficiency; however, the output stage 14 predominately sets the efficiency of the overall SSPA 10 in accordance with one embodiment. Alternatively, the embodiment can, at each stage, provide equal effect to the PAE and NPR performance of the SSPA 10.

In accordance with the embodiment of FIG. 1, the RF input power $P_{RF}$ (IN) is adjusted to achieve a desired RF output power level, which is generally indicated as $P_{RF}$ (OUT). The RF input power $P_{RF}$ (IN) can be adjusted using conventional techniques and is adjusted so that corresponding DC bias conditions can be more easily matched for any given RF output power level. The RF input power is varied proportionally to the RF output power. As the RF power input varies, the drain bias voltages $V_{DS1}$, $V_{DS2}$ and the drain currents $I_{DS1}$, $I_{DS2}$, which are controlled by varying the gate bias voltages $V_{GS1}$, $V_{GS2}$ respectively, are also varied to maintain constant PAE and NPR performance over a range of RF power output levels. These DC operating parameters (drain voltages, drain currents, gate voltages) are predetermined and correspond to a particular RF input power level. As such, for every RF input power $P_{RF}$ (IN), the DC operating parameters are adjusted to a set of predetermined values in order to achieve a desired RF output power $P_{RF}$ (OUT).

The DC operating parameters/conditions can be selected manually based on the measured RF input power $P_{RF}$ (IN), which can be measured using conventional techniques. In an alternate embodiment, the DC operating parameters are automatically selected based on the measured RF input power $P_{RF}$ (IN) with a manual override. The RF input power $P_{RF}$ (IN) can be manually or automatically adjusted depending on the application. For an on-orbit operation, the DC operating parameters of the SSPA 10 can be controlled at ground level via a satellite communications link.

The transistor devices 16, 18 are microwave field effect transistors that operate as voltage controlled current sources. In one non-limiting example, the transistor devices 16, 18 are generally based on gallium arsenide FET (GaAs FET) semiconductor technology. It is contemplated that other structurally complex FETs (GaN, HBTs, mHEMTs, etc.) as known in the art may be substituted or used in other exemplary embodiments for the GaAs FET devices shown. Such technology can be used with current L-band implementation. In another non-limiting embodiment, the FETs are based on gallium nitride FET (GaN-FET) or silicon carbide FET (SiC-FET) technology, which are generally used for high output variation implementations. The higher operating voltage range allows for higher RF output powers and a wider drain voltage range, which translates into wider output power variation capability. Of course, the transistor devices can be made of one or more metals, metal alloys, non-metals or a combination thereof and should not be limited to the configurations described herein. Furthermore, the SSPA 10 and the techniques described herein can be applied to various satellite communication frequency bands and should not be limited to implementation described herein (i.e. L-band implementation).

In one example, the transistor device 16 is an 8 W driver while transistor device 18 is a 50 W output device. Furthermore, the transistors devices are internally matched to 50 ohms according to this example. However, it should be understood that the transistor devices can be of any rating or have any electrical characteristics according to other embodiments.

The PAE of the SSPA is calculated by equation 1:

$$PAE = \frac{P_{RF}(\text{OUT}) - P_{RF}(\text{IN})}{P_{DC}(\text{total})} \quad \text{(equation 1)}$$

In this equation, PAE is a function of the RF output power ($P_{RF}$ (OUT)) of the SSPA 10 (at the output stage of the SSPA), the RF input power $P_{RF}$ (IN) of the SSPA 10 (at the driver stage of the SSPA), and the total DC input power of the SSPA 10 ($P_{DC}$ (total)). As such, the PAE of the SSPA can be calculated to ensure that the SSPA performance is optimized to provide constant PAE over a range of RF output power levels. The RF output power $P_{RF}$ (OUT) and the RF input power $P_{RF}$ (IN) are the total single or multi-carrier power levels, excluding inter-modulation products. In this example, the effects of gate voltage and currents on overall PAE are negligible. In one non-limiting embodiment, the SSPA 10 has a PAE of at least 38%.

The total DC input power $P_{DC}$ (total) of the SSPA 10 is calculated by equation 2:

$$P_{DC}(\text{total}) = V_{DS1} * I_{DS1} + V_{DS2} * I_{DS2} \quad \text{(equation 2)}$$

In this equation, the total DC input power $P_{DC}$ (total) of the SSPA 10 is a function of the drain bias voltage $V_{DS1}$ at the driver stage 12, the drain bias voltage $V_{DS2}$ at the output stage 14, the drain current $I_{DS1}$ measured at the driver stage 12, and the drain current $I_{DS2}$ measured at the output stage 14.

Measuring the NPR is one technique used in measuring linearity of the SSPA 10. NPR is generally an approximation in which signal levels need to be measured. Typically, inter-modulation IMD can be characterized by the measurement of the carrier to inter-modulation product levels (C/I). IMD levels are a function of carrier signal level or power back-off, which is the maximum power for a given amplifier or transistor device and can vary depending on the device. Improving the SSPA performance at a given back-off allows for the maintenance of reasonable efficiency. To achieve good linearity, the SSPA is operated at back-off However, back-off provides good linearity but sacrifices efficiency. The bias conditions for the transistor devices 16, 18 are selected such that efficiency is improved as described above, without sacrificing linearity.

Although SSPA IMD performance is predictable to a first-order, satellite payloads perform extensive characterization of IMD to meet performance over varying operating conditions. One technique used for this characterization is the NPR measurement, which simulates a large number of carriers (input signals) using an input noise spectrum, which is notched out over a small portion of the measured frequency range. The non-linear SSPA 10 results in the generation of IMD products, which results in spectral re-growth filling in the output noise spectrum notch. The measured depth of the notch is the NPR value. Thus, NPR can be considered a measure of C/I according to the embodiment shown. Of course, other techniques of measuring linearity for the SSPA can be used in other exemplary embodiments of the invention and should not be limited to the examples described herein.

The SSPA 10 is configured to continuously operate over at least about a 5 dB output power variation at high and constant PAE and NPR. This is achieved by varying the drain voltage and gate voltage of the transistor devices 12, 14. More specifically, varying the drain bias voltages $V_{DS1}$, $V_{DS2}$ and the gate bias voltages $V_{GS1}$, $V_{GS2}$, which adjusts the drain currents $I_{DS1}$, $I_{DS2}$ respectively, to a set of predetermined values will enable the SSPA 10 to continuously operate over at least about a 5 dB output power variation while maintaining high and constant PAE and NPR.

FIG. 2 illustrates an exemplary table of predetermined DC bias conditions for two extreme power levels (high and low) for the SSPA 10 in FIG. 1. In this example, in order to achieve the RF power output level 46 dBm with a gain of 41.4 dB, a PAE of 38.77% and an NPR of 14.33, a set of predetermined DC bias conditions is selected based on the measured RF input power (not shown in table). The set of predetermined DC bias conditions selected (manually or automatically) in this example are as follows: the drain voltage at the driver stage ($V_{DS1}$) is adjusted to 6V, the drain current at the driver stage ($I_{DS1}$) is adjusted to 1.7 A, the drain voltage at the output stage ($V_{DS2}$) is adjusted to 9.5V, and the drain current at the output stage ($I_{DS2}$) is adjusted to 4 A. The drain current ($I_{DS2}$) is varied to 4 A by adjusting the gate voltage ($V_{GS2}$) at 9V. The PAE and the NPR are 38.77% and 14.33 dB respectively for the given RF power output level of 46 dBm. When the RF power output level is varied from 46 to 41 dBm, the PAE and NPR is maintained by selecting (manually or automatically) another set of predetermined DC bias conditions. In this example, RF power output level is varied from 46 to 41 dBm while maintaining constant PAE and NPR by adjusting the drain voltage at the driver stage ($V_{DS1}$) to 4V, the drain current at the driver stage ($I_{DS1}$) to 1.1 A, the drain voltage at the output stage ($V_{DS2}$) to 5.5, and the drain current at the output stage ($I_{DS2}$) to 2 A. The drain current ($I_{DS2}$) is varied to 2 A by adjusting the gate voltage ($V_{GS2}$) at 9V. As illustrated in this example, consistent PAE (efficiency) and NPR (linearity) can be obtained by varying the gate voltage (or drain current) and drain voltage of the transistor devices 16, 18 at stages 12, 14 respectively.

In one embodiment, the gate voltage and drain voltage of the transistor devices 16, 18 are varied simultaneously by biasing the gate input and the drain input of the transistor devices 16, 18. In an alternative embodiment, the gate voltage and drain voltage of the transistor devices 16, 18 are varied in a synchronous manner. In any case, the SSPA 10 is configured to obtain consistently high efficiency (PAE) over at least approximately 5 dB of RF output power variation with consistent NPR as shown. Furthermore, such consistent PAE and NPR can be obtained while the SSPA 10 is continuously operating within the RF output power range.

Figure 3:
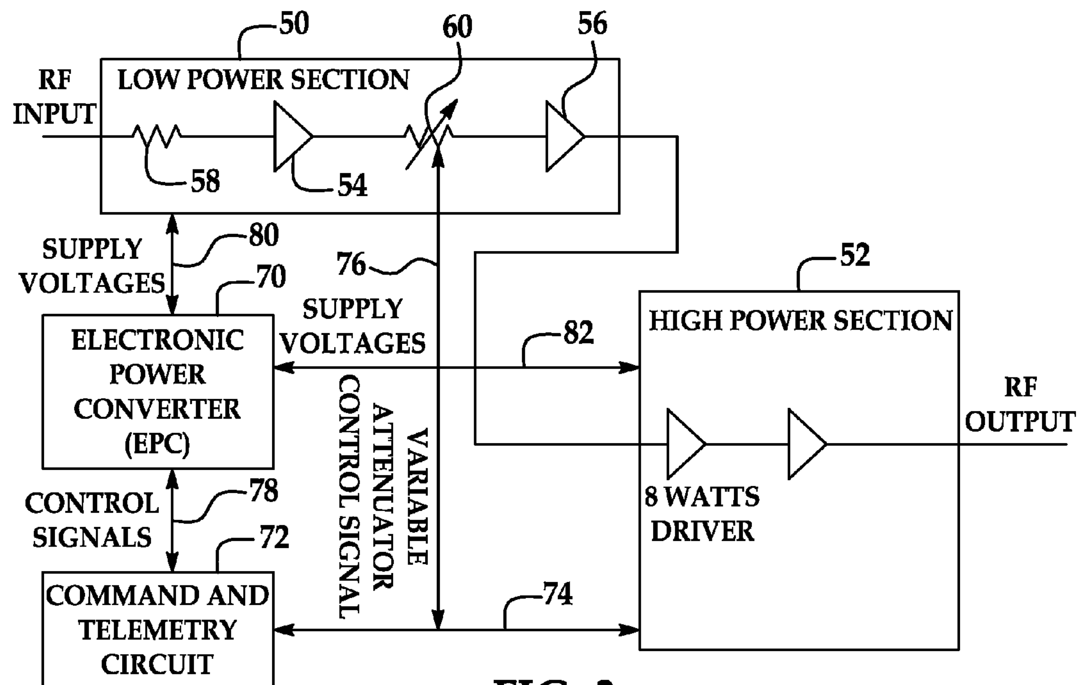
FIG. 3 illustrates a schematic of the architecture of the SSPA according to an embodiment of the invention.

FIG. 3 illustrates a specific and non-limiting implementation of the SSPA 10. Specifically, FIG. 3 illustrates the SSPA architecture using MMICS (e.g., transistor devices, attenuators, etc.) and internally matched devices. This SSPA architecture includes a low power section 50 and a high power section 52 comprising one or more MMICS (e.g., transistor devices, attenuators, etc.), which are used to reduce the size and weight of the SSPA. The low power section 50 includes transistor devices 54, 56, a fixed attenuator 58, and a variable attenuator 60 serially coupled to one another. The low power section 52 is configured to receive RF input power $P_{RF}$ (IN), which is adjusted in the low power section 52. In particular, the fix attenuator 58 operably adjusts the gain prior to the SSPA 10 such that a desired power level can be set into the HPA. The variable attenuator 60 is configured for temperature compensation and to compensate for unit to unit gain variations. Thus, when there is a flux in the RF output power due to temperature, the variable attenuator 60 properly adjusts the gain in the lower power section 52 accordingly.

The high power section 54 generally comprises the SSPA 10 shown in FIG. 1. As described above, the gate voltage and drain voltages at both stages 12, 14 of the SSPA are varied to maintain constant PAE and NPR performance over a range of RF output power levels.

An electronic power converter module (EPC) 70 and a command and telemetry circuit 72 are in signal communication with the low power section 50 and the high power section, as shown. The command and telemetry circuit 72 is an interface at the SSPA level and is configured to receive control signals, which are generally indicated by double arrow 74, from the high power section 54 to compensate for temperature variation. More specifically, the command and telemetry circuit 72 is configured to receive control signals 74 comprising temperature telemetry and analyze the same to compensate for temperature variation. This is accomplished by adjusting the variable attenuator 60 based on the information processed by the command and telemetry circuit 72 through a control signal, which is generally indicated by double arrow 76. The command and telemetry circuit 72 controls the operations of the EPC 70 via command signals, indicated by double arrow 78. The command and telemetry circuit 72 is configured to select and set the DC bias conditions and command the EPC 70 to operate based on the selected DC bias conditions. In one exemplary embodiment, the command and telemetry circuit 72 includes a controller for carrying out the functions described herein.

As used herein, the term "controller" refers to an application specific device circuit (ASIC), and electronic circuit, a processor (shared, dedicated, or group) and memory that executes one or more software or firmware programs/algorithms, a combinational logic circuit, and/or other suitable components that provide the described functionality.

In accordance with an embodiment, the EPC 70 includes one or more DC-to-DC power converters (not shown), which can generate different output voltages thereby providing different gate voltages and drain voltages to the transistor devices 16, 18. The EPC 70 communicates with the low power section and the high power section via supply voltage signals, which are generally indicated by double arrows 80, 82. In operation, the EPC 70 generates output voltages based on the set of DC bias conditions selected by the command and telemetry circuit 72.

In SSPA operation, the SSPA 10 receives an RF input power $P_{RF}$ (IN) and is measured accordingly. Next, a set of predetermined DC bias conditions are selected based the RF input power $P_{RF}$ (IN). In one embodiment, the command and telemetry circuit 72 selects the set of predetermined DC bias conditions to implement on the SSPA. The RF input power $P_{RF}$ (IN) is adjusted to more closely match a set of predetermined DC bias conditions according to one embodiment. Then, the gate inputs and drain inputs of transistor devices of the SSPA are biased according to the selected set of predetermined DC bias conditions to achieve a desired RF output power $P_{RF}$ (OUTPUT). The EPC 70 controls the biasing for the gates and drain voltages of the SSPA. As the RF output power $P_{RF}$ (OUTPUT) is adjusted, a new set of predetermined DC bias conditions is selected to achieve that given desired RF output power $P_{RF}$ (OUTPUT) and maintain constant PAE and NPR performance. The SSPA is configured to maintain constant PAE and NPR performance as the SSPA is continuously operating over a range of RF output power levels.

Figure 4:
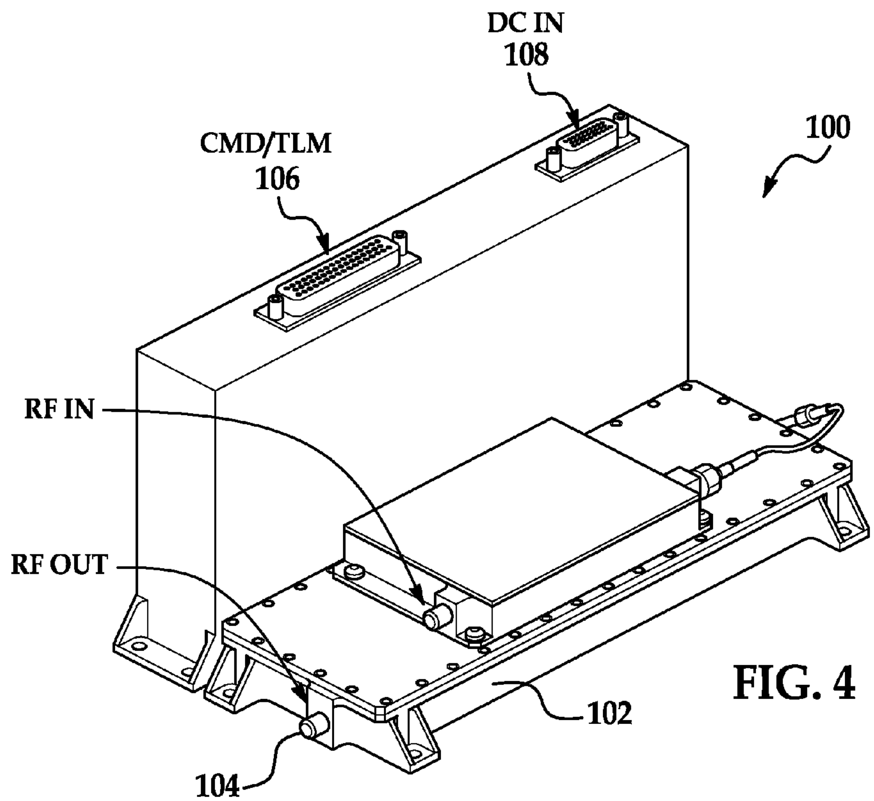
FIG. 4 illustrates an exemplary configuration of packaging the SSPA according to an embodiment of the invention.

FIG. 4 illustrates an exemplary embodiment of packaging the SSPA along with the EPC module 70 and the command and telemetry circuit 72 forming an SSPA module 100. The SSPA module 100 generally includes an RF input power port 102, an RF output power port 104, a command and telemetry circuit connector interface 106 associated with the command and telemetry circuit 72, and a DC input port 108 associated with the EPC 70. Because the SSPA includes MMICs and internally matched devices as described above, the size and weight of the SSPA and hence the size and weight of the SSPA module 100 is reduced. As such, a large number of SSPAs, which are typically involved in a satellite implementation, can be incorporated in a multiport power amplifier (MPA).

FIG. 5 illustrates an SSPA implemented into an MPA configuration using a conventional microwave Butler matrix. Specifically, FIG. 5 illustrates a simplified block diagram of a MPA 120 having a Butler input/output matrix 122. The MPA 120 in this example includes one or more power amplifiers (PA) 124, which are implemented by individual SSPAs. The MPA 120 provides an attractive solution to handle unbalanced traffic among multiple antenna beams and traffic variations over time. Thus, combining the MPA attributes of maintaining equal input power levels into each SSPA for varying input signal levels into the MPA, with variable output power capability of the SSPA, provides a wide effective operating dynamic range for SATCOM payloads. The SSPAs in this example handle multiple signals and hence their linearity, efficiency and output power has to be coordinated effectively. Therefore, the adequate sizing of the PAs and their associated output back off is carefully chosen in order to properly utilize DC power. The techniques/methods described above can be used to improve the PA performance.

It will be understood that the number of PAs and the size of the Bulter matrix will vary depending on the application and the invention should not be limited to the configuration as shown.

A method of fabricating an SSPA having variable output power in accordance with one exemplary embodiment is illustrated in FIG. 6. At operational block 200, couple a first transistor device to a second transistor device. Bias a drain input of each of the first and second transistor device at operational block 202. At operational block 204, bias a gate input of each of the first and second transistor device varying a drain to source current of each of the first and second transistor device to enable the SSPA to maintain high power added efficiency (PAE) and consistent linearity over a range of output power levels. In accordance with an embodiment, an electronic power converter in signal communication with the second transistor device is used to bias the gate input and drain input of each of the first and second transistor.

Other embodiments are contemplated, and the invention is not limited to the embodiment described. For example, the SSPA 10 shown in FIG. 1 does not have to continuously operate over the output power variation. Instead, the SSPA 10 can operate periodically or otherwise. In another example, the RF input power $P_{RF}$ (IN) does not have to be adjusted to achieve a desired RF output power level. Other ways of achieving a desired RF output power level can be used, such as, for example, adjusting other components or variables of the SSPA 10.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A method of fabricating a solid state power amplifier (SSPA) having variable output power, comprising:
- coupling a first transistor device to a second transistor device;
- biasing a drain input of the first transistor device with a first transistor drain bias voltage and biasing a gate input of the first transistor device with a first transistor gate bias voltage;
- biasing a drain input of the second transistor device with a second transistor drain bias voltage and biasing a gate input of the second transistor device with a second transistor gate bias voltage, the second transistor drain bias voltage being a different value than the first transistor drain bias voltage, thereby varying a drain to source current of each of the first and second transistor devices to enable the SSPA to maintain consistent power added efficiency (PAE) and consistent linearity over a range of output power levels; and
- maintaining a PAE of at least 38% over the range of output power levels, the range of output power levels being at least 5 dB.

2. The method of claim 1, including simultaneously biasing the gate input of the first transistor devices and drain input of the first transistor device with the gate input of the second transistor device and the drain input of the second transistor.

3. The method of claim 1, including biasing according to a predetermined set of biasing conditions the gate input and the drain input of the first transistor device and the second transistor device based on an input power level received by the SSPA.

4. The method of claim 3, including adjusting the input power level based on a desired output power level.

5. The method of claim 1, including maintaining consistent PAE and consistent linearity while the SSPA is continuously operating over the range of output power levels.

6. The method of claim 1, wherein the first transistor device and the second transistor device are comprised of at least one microwave field effect transistor.

7. The method of claim 1, including providing the first transistor device and the second transistor device being made from at least one of gallium arsenide field effect amplifier device semiconductor technology, gallium nitride technology, silicon carbide technology or a combination thereof.

8. The method of claim 1, including providing an electronic power converter biasing the gate input and the drain input of the first and second transistor device.

9. A method of fabricating a solid state power amplifier (SSPA) having variable output power, comprising:
- coupling a first transistor device to a second transistor device;
- selecting a predetermined set of direct current (DC) biasing conditions based on an input power level received by the SSPA;
- biasing a drain input of the first transistor device with a first predetermined transistor drain bias voltage and biasing a gate input of the first transistor device with a first predetermined transistor gate bias voltage according to the predetermined set of DC biasing conditions;
- biasing a drain input of the second transistor device with a second predetermined transistor drain bias voltage and biasing a gate input of the second transistor device with a second predetermined transistor gate bias voltage, the second predetermined transistor drain bias voltage being a different value than the first predetermined transistor drain bias voltage, according to the predetermined set of DC biasing conditions, thereby varying a drain to source current of each of the first and second transistor devices to enable the SSPA to maintain consistent power added efficiency (PAE) and consistent linearity over a range of output power levels; and
- maintaining a PAE of at least 38% over the range of output power levels the range of output power levels being at least 5 dB.

10. The method of claim 9, including adjusting the input power level based on a desired output power level.

11. The method of claim 9, including maintaining consistent PAE and consistent linearity while the SSPA is continuously operating over the range of output power levels.

12. The method of claim 9, wherein the first transistor device and the second transistor device are comprised of at least one microwave field effect transistor.

13. The method of claim 9, including providing the first transistor device and the second transistor device being made from at least one of gallium arsenide field effect amplifier device semiconductor technology, gallium nitride technology, silicon carbide technology or a combination thereof.

14. A solid state power amplifier (SSPA) having variable output power, comprising:
- a first transistor device coupled to a second transistor device; and
- a power converter in signal communication with the first transistor and the second transistor, the power converter being configured to:
  - bias a gate input of the first transistor device with a first predetermined transistor gate bias voltage and bias a drain input of the first transistor device with a first predetermined transistor drain bias voltage according to a predetermined set of biasing conditions;
  - bias a gate input of the second transistor device with a second predetermined transistor gate bias voltage and bias a drain input of the second transistor device with a second predetermined transistor drain bias voltage, the second predetermined transistor drain bias voltage being a different value than the first predetermined transistor drain bias voltage, according to the predetermined set of DC biasing conditions, thereby varying a drain to source current of each of the first and second transistor devices to enable the SSPA to maintain consistent power added efficiency (PAE) and consistent linearity (NPR) over a range of output power levels; and
  - maintain a PAE of at least 38% over the range of output power levels, the range of output power levels being at least 5 dB.

15. The SSPA of claim 14, wherein consistent PAE and consistent linearity are maintained while the SSPA is continuously operating over the range of power output levels.

16. The SSPA of claim 14, wherein the first transistor device and the second transistor device are comprised of at least one microwave field effect transistor.

* * * * *